United States Patent
Can et al.

(10) Patent No.: US 7,005,924 B2
(45) Date of Patent: Feb. 28, 2006

(54) CURRENT LIMITING CIRCUIT WITH RAPID RESPONSE FEEDBACK LOOP

(75) Inventors: Sumer Can, San Jose, CA (US); William B. Shearon, Findlay, OH (US); Raymond Giordano, Flemington, NJ (US)

(73) Assignee: Intersil Americas Inc., Milpitas, CA (US)

( * ) Notice: Subject to any disclaimer, the term of this patent is extended or adjusted under 35 U.S.C. 154(b) by 25 days.

(21) Appl. No.: 10/886,793

(22) Filed: Jul. 8, 2004

(65) Prior Publication Data

US 2005/0184809 A1 Aug. 25, 2005

Related U.S. Application Data

(60) Provisional application No. 60/545,846, filed on Feb. 19, 2004.

(51) Int. Cl.
*H02H 7/20* (2006.01)
(52) U.S. Cl. .................. 330/298; 330/260; 330/207 P; 323/316
(58) Field of Classification Search ............... 330/298, 330/260, 207 P; 323/316
See application file for complete search history.

(56) References Cited

U.S. PATENT DOCUMENTS

| | | | | |
|---|---|---|---|---|
| 4,156,150 | A | * | 5/1979 | Harrigan et al. ................ 307/2 |
| 4,204,266 | A | * | 5/1980 | Kammiller et al. ........... 363/98 |
| 4,253,138 | A | * | 2/1981 | Shelly et al. ............ 363/56.07 |
| 4,484,331 | A | | 11/1984 | Miller ......................... 372/38 |
| 5,136,459 | A | * | 8/1992 | Fararooy .................... 361/93.2 |
| 5,638,244 | A | * | 6/1997 | Mekanik et al. .............. 361/62 |
| 5,982,160 | A | | 11/1999 | Walters et al. .............. 323/282 |
| 2003/0142519 | A1 | | 7/2003 | Walters et al. ................ 363/89 |
| 2004/0070382 | A1 | | 4/2004 | Walters et al. .............. 323/284 |

* cited by examiner

*Primary Examiner*—Patricia Nguyen
(74) *Attorney, Agent, or Firm*—Allen, Dyer, Doppelt, Milbrath & Gilchrist, P.A.

(57) ABSTRACT

The current limiting circuit of the present invention includes a transconductance amplifier having two outputs and forming a conventional feedback loop. A first output connects to an output transistor and a second output is a replica output used to form a rapid response feedforward path to control the gate of the output transistor, for example, an external MOSFET.

29 Claims, 4 Drawing Sheets

CURRENT LIMITING CIRCUIT WITH RAPID RESPONSE FEEDBACK LOOP

RELATED APPLICATION

This application is based upon prior filed copending provisional application Ser. No. 60/545,846, filed Feb. 19, 2004.

FIELD OF THE INVENTION

This invention relates to current regulation circuits, and more particularly, the present invention relates to a current regulation circuit using a feedback circuit.

BACKGROUND OF THE INVENTION

New generation power supplies are subject to very fast changing load currents, which are difficult to limit. As a result, there is a requirement for current limiting circuits to incorporate appropriate circuits that sense the current flow through a transistor or other circuit, limit the amount of voltage or current, and permit discharge. These types of circuits are used in hot plug circuits, linear regulators, power converters, and similar circuits. Also, new generation power supplies are subject to very fast changing load currents, which are difficult to limit with existing circuit designs.

Prior art current limiting circuits typically have used a current regulation feedback loop containing a large output device operative as a switch. For example, in one type of current limiting circuit, an external Metal Oxide Semiconductor Field Effect Transistor (MOSFET) has its gate connected to a single output of a transconductance amplifier, which is operative as an error amplifier. The prior art current regulation feedback circuit includes the error amplifier, an external output transistor, and a current sensing resistor. These components connect to the drain forming a feedback loop. The current sensing resistor is typically connected to a set resistor to aid in providing a reference, and in turn, connects to an inverting input INV of the transconductance amplifier. The non-inverting input is typically connected between the output transistor, for example, the external MOSFET, and the current sensing resistor.

In this conventional type of circuit, the feedback loop is normally slow because of the large capacitive loading on the gate of the output transistor, typically as the output of a sense amplifier. The over-current situation in this circuit is not detected until the gate of this large output transistor is pulled down to a level where the feedback loop goes into regulation. The over-current is sensed and the information is available at the output of the error amplifier. Because of the large gate capacitance, the loop slows and information is not transferred back to the input of the error amplifier fast enough to accomplish regulation.

It would be advantageous to solve this prior art drawback of fast current limiting in these prior art devices and circuits as described above. Some prior art circuits have used high speed operational amplifiers, for example, as commonly found in some hot plugs to form a quick response circuit output. They are also often used in prior art linear regulators. These circuits, however, can be expensive and complicated to implement.

SUMMARY OF THE INVENTION

It is therefore an object of the present invention to provide a current limiting circuit that solves the drawbacks as described above of fast current limiting in prior art current limiting circuits having a current regulation feedback loop.

In accordance with the present invention, a second (replica) output of an error amplifier, for example, a transconductance amplifier, drives a gate of a smaller feedforward transistor. This over-current information is rapidly acted upon by pulling a gate of a larger, external output transistor to a level where the current regulation loop is required. Once the gate voltage is quickly lowered to this level, a high gain feedback loop keeps the current at its designed current limiting level. In the present invention, a dual output error amplifier is formed as a transconductance amplifier and configured in a conventional feed feedback loop using one of the outputs of the amplifier. The second output is a replica output of the error amplifier and used to form a rapid response feedforward path to control the gate of the external output transistor.

In accordance with the present invention, a current limiting circuit includes the error amplifier having first and second outputs. The output transistor is connected to the first output and forms a feedback loop. The second output is a replica output of the error amplifier and forms a rapid response feedforward path with the output transistor to aid in fast current limiting. The error amplifier is preferably a transconductance amplifier and the output transistor preferably comprises a MOSFET.

The feedback loop is preferably a current regulating feedback loop and the feedforward path is operative to control the output transistor, which includes a gate that is pulled down to a level where the feedback loop goes into regulation. Over-current information is acted upon by pulling a gate of the output transistor to a level required by current regulation, wherein the feedback loop maintains current at the designed current level. The sensing resistor is operative for sensing voltage or current flow within the feedback loop. The transconductance amplifier preferably has a high voltage input and mirrored circuits. These can be formed as a charge pump circuit, in one aspect of the present invention.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figures 1, 1A:
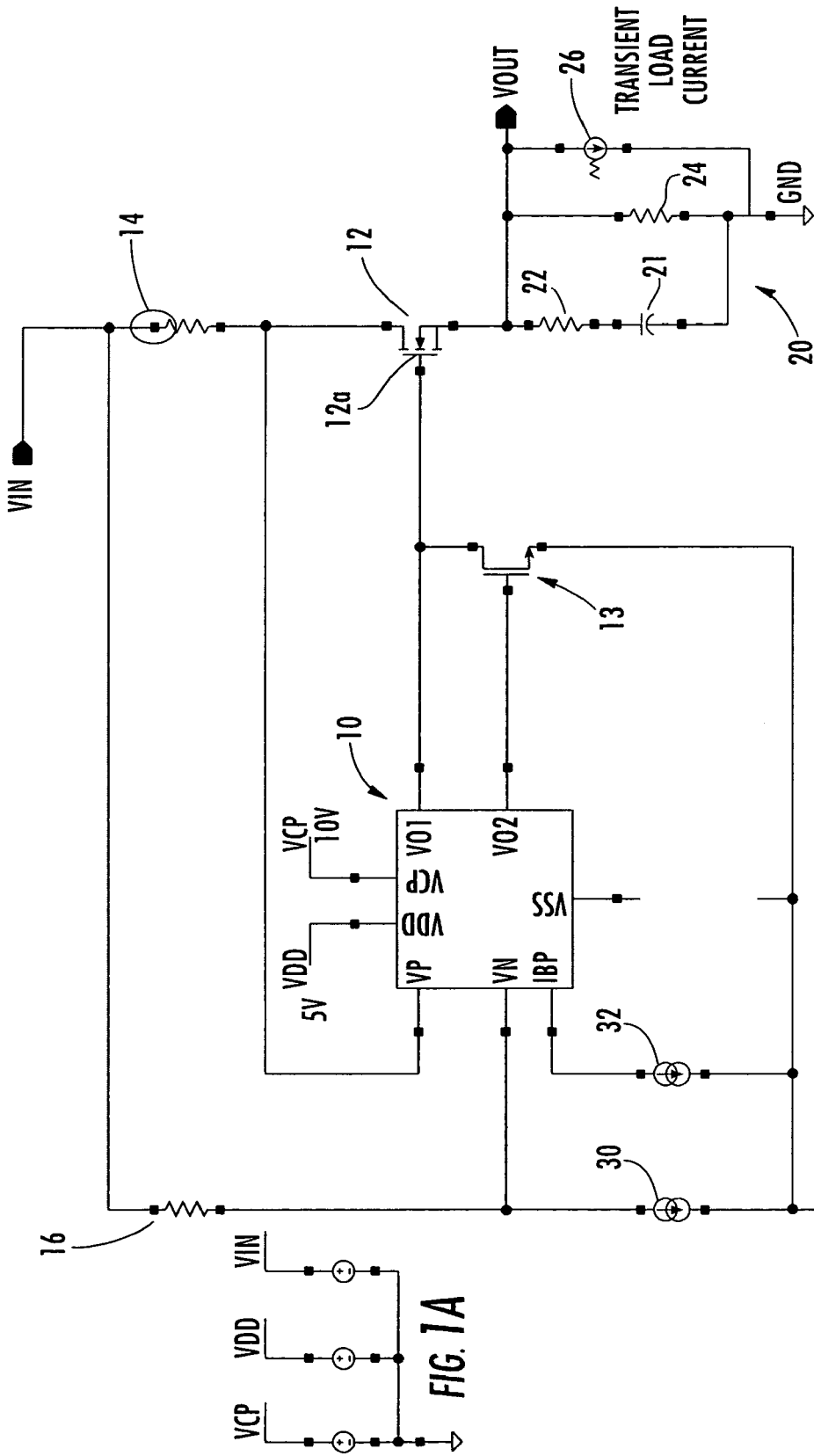
FIG. 1 is a high level schematic circuit diagram of the current regulating circuit of the present invention.
FIG. 1A is a schematic circuit diagram showing ground connections to VCP, VDD and VIN.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention solves the problem of fast current limiting in a current limiting circuit that uses a current regulation feedback loop.

The present invention overcomes the disadvantages of prior art current limiting circuits in which the feedback loop is normally slow because of the large capacitive loading on the gate of the output transistor, for example, as the output of a sense or transconductance amplifier. The over-current situation in the circuit is not detected until the gate of a large output transistor is pulled-down to a level where a feedback loop goes into regulation. In these prior art circuits, the over-current is already sensed and the information available at the output of the error amplifier. Because of the large gate capacitance, the loop slows and the information is not transferred back to the input of the error amplifier fast enough to accomplish regulation.

These circuits often have included a transconductance amplifier. Some prior art circuits have incorporated transconductance amplifiers in ripple regulators for a DC-DC converter, including inductor current sensing, use of synchronization in multiphase synthetic ripple voltage regulators, and a regulator for a bias current of a semiconductor laser diode.

Examples of such devices are disclosed in U.S. Pat. Nos. 4,484,331 and 5,982,160; and U.S. published patent application Nos. 2003/0142519 and 2004/0070382, the disclosures which are hereby incorporated by reference in their entirety.

Although transconductance amplifiers are used in the devices disclosed in these patents and published patent applications, they do not solve the problems regarding fast current limiting as described above.

In accordance with the present invention, a second (replica) output of an error amplifier, for example, a transconductance amplifier is connected to a smaller feedforward transistor. This over-current information is rapidly acted upon by pulling a gate of the larger external output transistor to a level the current regulation loop requires. Once the gate voltage is quickly lowered to this level, a high gain feedback loop maintains the current at the level of the designed current limit.

In the present invention, a dual output error amplifier, i.e., the transconductance amplifier has a first output. It is configured in a conventional feedback loop, which includes the output transistor. A second output is a replica output of the error amplifier and used to form a rapid response feedforward path to control the gate of the external output transistor.

FIG. 1 shows a transconductance amplifier 10 of the present invention having two outputs labeled VO1 and VO2. VO1 is a conventional output and connected to the gate 12a of an external output transistor illustrated as the MOSFET 12. VO2 is a replica output and connected to a feedforward transistor 13 in a rapid response feedforward path to control the gate 12a of the external output transistor, i.e., the external MOSFET 12. The transconductance amplifier is operative as a dual output error amplifier 10 and includes various pin connections, including the positive voltage pin VP as a non-inverting input, and a negative voltage pin VN as the inverting input.

As illustrated in the schematic circuit diagram of FIG. 1, the output of the external MOSFET 12 is connected to a sensing resistor (Rsense) 14, and in turn, is looped to a set resistor (Rset) 16, connected to the inverting input VN, which aids in providing a reference. The sensing resistor 14 is operative to sense current flow. The non-inverting input is connected between the sensing resistor 14 and the external MOSFET 14. Power pins VDD and VCP are connected to respective voltage sources, which respectively are five volts (VDD) and ten volts (VCP). As described before, VN as the inverting input is connected to the sensing resistor (Rsense) 14 and set resistor (Rset) 16. These pin connections are also shown as connected to ground in FIG. 1A, showing the VCP, VDD and VIN connections.

With the present invention, the slow response of a prior art current regulation loop that occurs during the setting of large load currents is overcome. The gate capacitance is discharged to the external MOSFET operative as a switch. The output VO1 drives the large external MOSFET 12 operative as a switch and the output VO2 is a replica output that drives the smaller feedforward transistor 13 as its gate to a faster response. Because the feedforward transistor 13 is connected to the gate 12a of the output transistor 12, the faster response at output VO2 quickly pulls down the gate 12a to a level required by the current regulation loop. Once the gate voltage is lowered to this level, the high gain feed loop circuit maintains the current at the designed current limit level. The second output VO2 acts as a fast responding circuit that aids the current regulation loop.

As shown in the schematic circuit diagram of FIG. 1, other components include an output circuit 20 having a load capacitor 21 in series with a resistor 22 and a parallel connected load resistor 24. These components are in parallel to the transient load current 26. These components are connected to the output MOSFET transistor 12 and form the voltage output VOUT.

A set biasing component (Iset) 30 and a current biasing component (Ibias) 32 are connected to the respective inverting input VN of the transconductance amplifier 10 and a biased current input IBP. In this circuit, Icr=(Rset\Rsense)* Iset. Icr is also set to 2 amperes, in this non-limiting example. The MOSFET 12 is connected to the output circuit 20 having the VOUT terminal and the load resistor 24 in parallel with resistor 22 and its serially connected load capacitor 21. These components are parallel to a transient load current 26.

It should be understood that a conventional feedback loop locks and limits a current at one level. In the present invention, circuits drive a gate from the first output V01 and the current flowing through the transistor is sensed with the sensing resistor 14. The VN input is internally set at a reference voltage by the circuits having the set resistor 16 as illustrated. The reference current Iset 30 and the ICR are valued according to the formula described above, and define the current limit level, allowing about a 25 millivolt drop across the set resistor 16 as shown in FIG. 1. The loop is activated and is regulated at a desired current level $I_{CR}$.

The output voltage will start dropping and maintain current in regulation with the current through the external MOSFET transistor 12. When the voltage/current starts increasing, it becomes very quick. In prior art devices, that change would be slow because of the large gate capacitors of a transistor. It would take some time to drive the VO1 pin for the gate of that transistor down. The normal transconductance amplifier is designed to move this charge down or discharge up. Voltage transients can be measured in the output and the input voltage over a sensing resistor can suddenly move down and the sudden change in the input of the amplifier can cause a change in the output pin VO1. The change would be slow because of the large gate capacitance in prior art circuits and a normal transconductance amplifier.

In the present invention, the second output pin V02 turns on the smaller transistor 13 very quickly, which changes the gate capacitor very quickly. When the gate voltage of the output transistor 12 reaches a certain level, which defines the limited current, the feedback loop is locked and regulation occurs. Thus, there is a fast response to a fast changing volt/current and the regulation is quickly reached.

Figure 3:
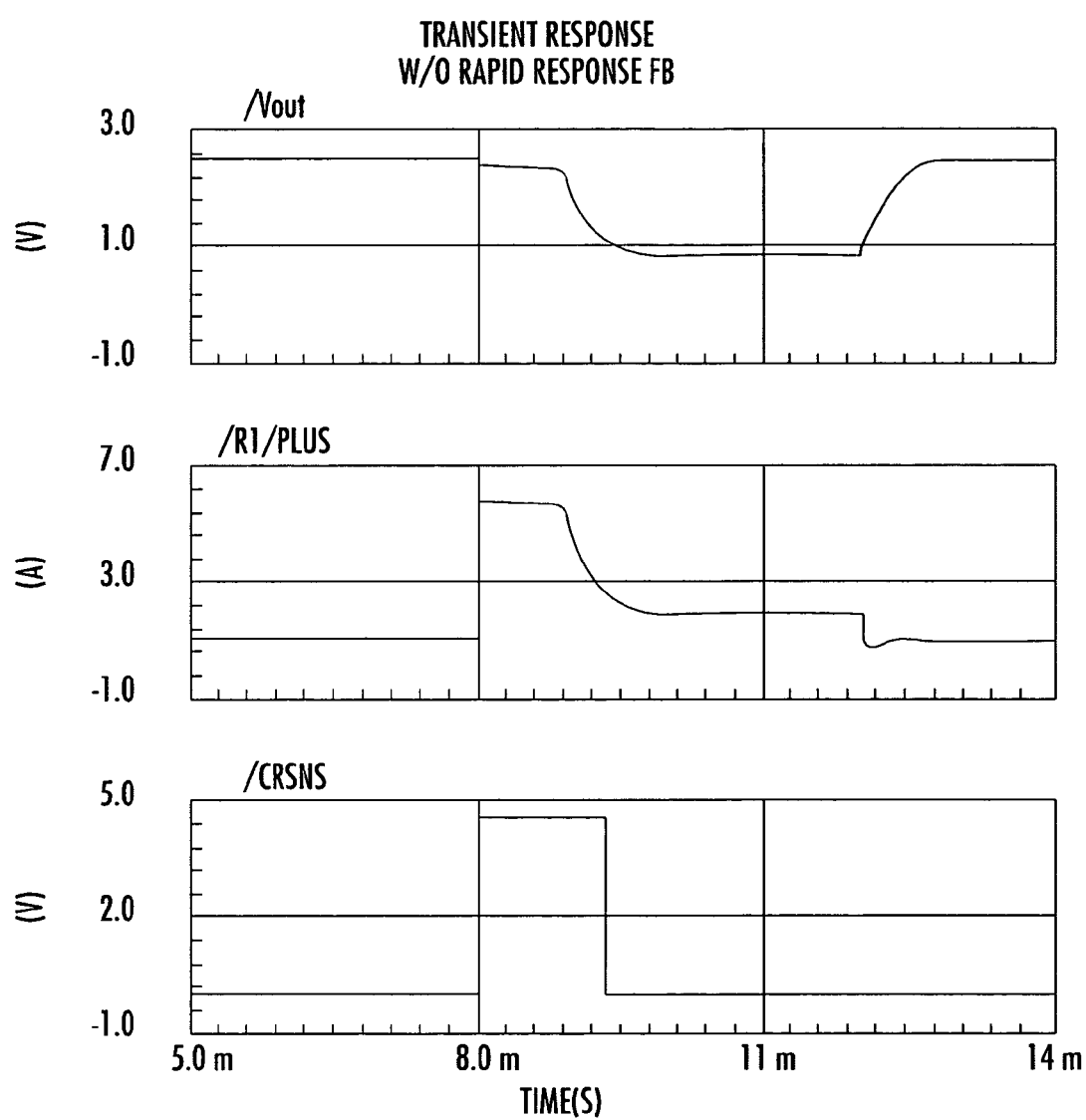
FIG. 3 is a graph showing a transient response without the rapid response.
Figure 4:
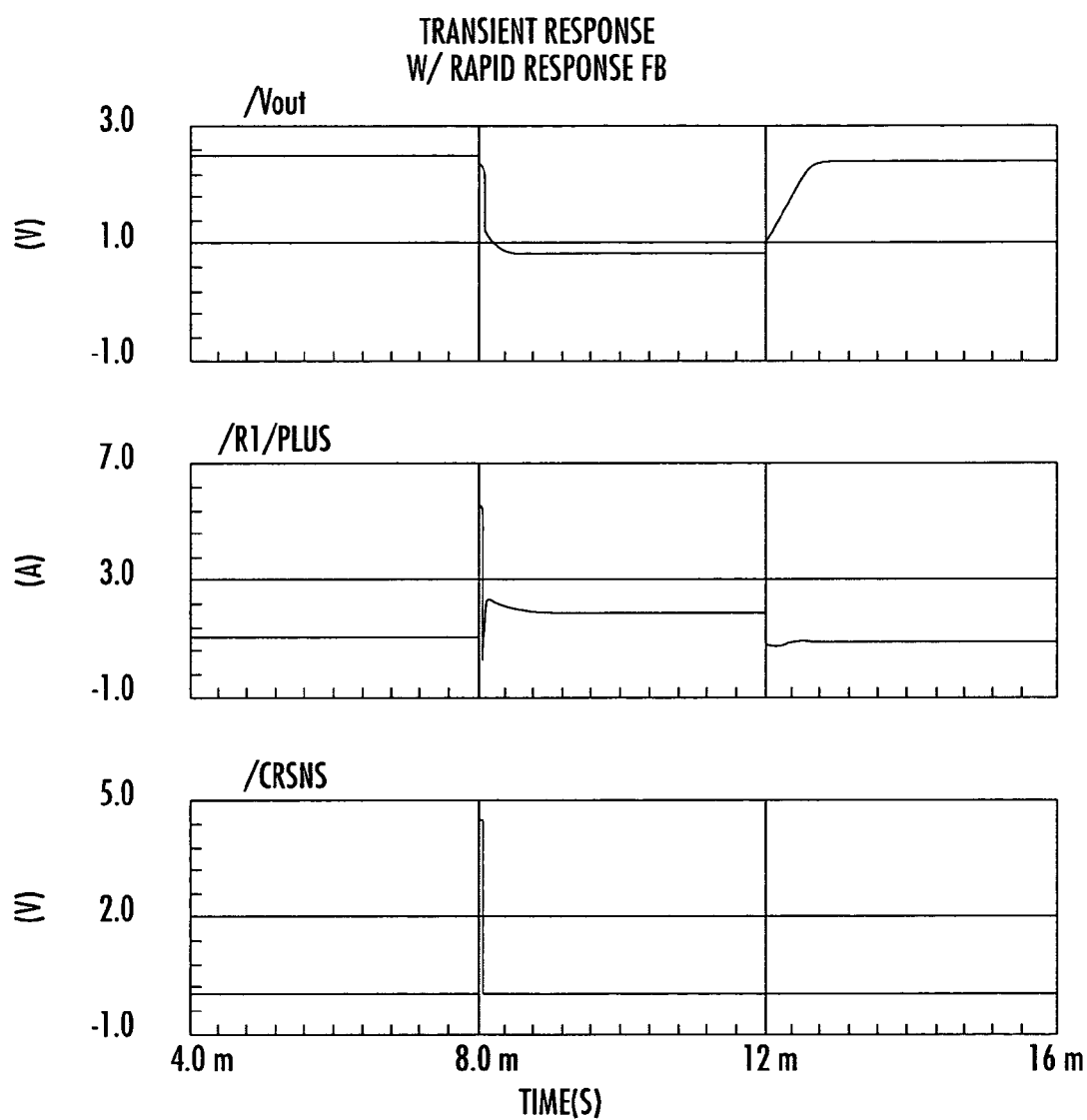
FIG. 4 is a graph showing a transient response with a rapid response.

FIGS. 3 and 4 are graphs showing the transient response without the rapid response (FIG. 3) and a transient response with the rapid response at the second output (FIG. 4).

Figure 2:
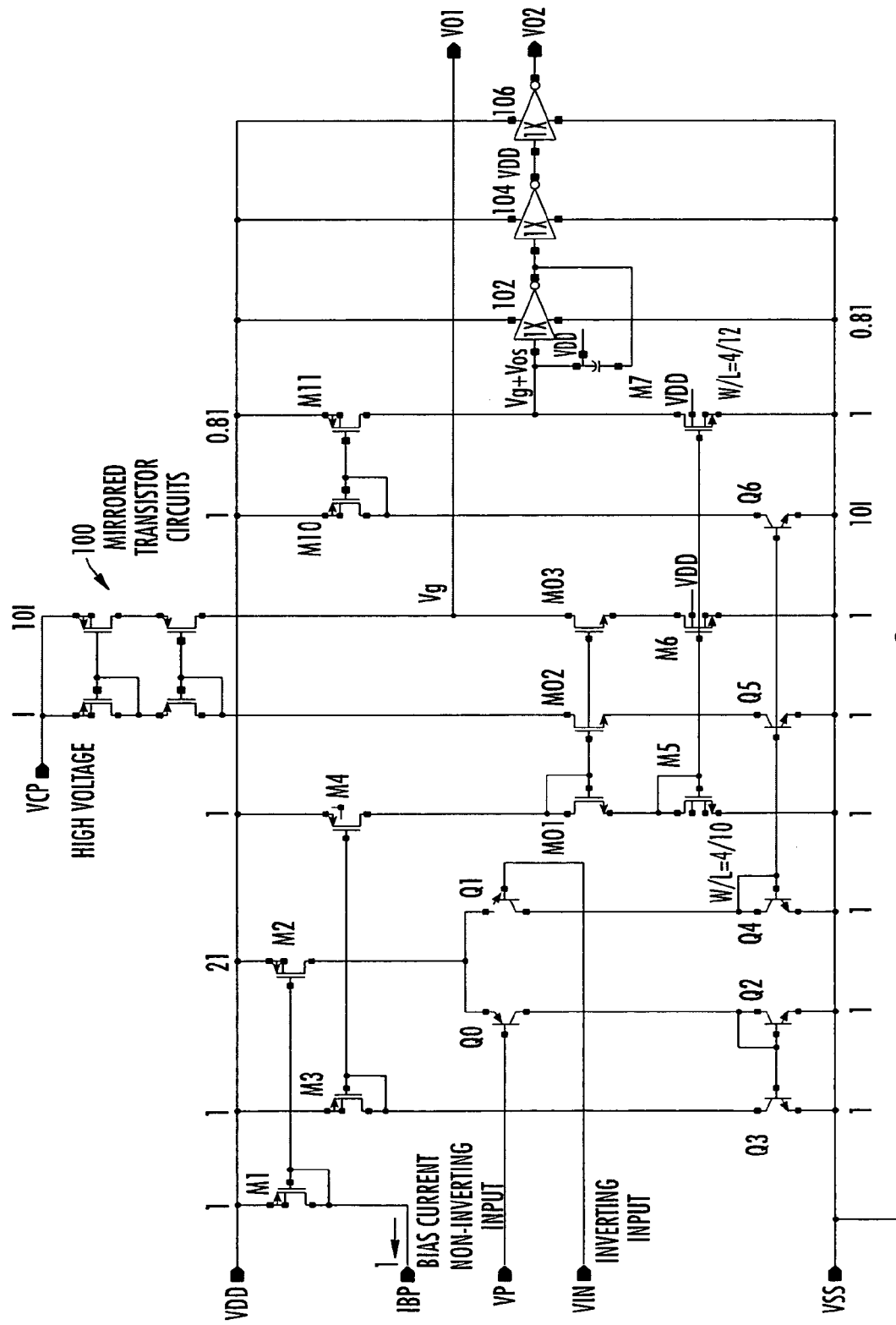
FIG. 2 is a more detailed schematic circuit diagram of an example of the transconductance amplifier shown in FIG. 1 that can be used with the present invention.

FIG. 2 is a schematic circuit diagram showing an example of a transconductance amplifier 10, such as shown in FIG. 1, and showing details of an example of a type of circuit that could be used for the transconductance amplifier. The different inputs are shown as VCP, VDD, VP, VN, IBP, and VSS. The outputs are V01, V02. VSS connects as ground as illustrated on the schematic circuit. Transistors M1 to M5 are preferably high voltage DMOS transistors that are used as cascades to prevent breakdown. M7 is a weaker transistor device to introduce offset VOS. Output V02 is "low" during normal operation.

In this circuit, the high voltage input VCP acts as a charge pump circuit with mirrored transistor circuits as illustrated at 100. M3 and M4 are mirrored and M5 and M6 pull down an output M6. The connection between Q0 and Q1 is mirrored and forms a differential transistor pair in which the transistor bases are connected to non-inverting input VP and inverting input VN. Q2 and Q4 are bias connected as a mirrored circuit with current flowing in the branch mirrored circuit Q2 and Q3.

As illustrated further in FIG. 2, the circuits as described form comparators in the transconductance amplifier and drive the output MOSFET transistor 12 operative as a switch via V02 and feedforward transistor 13 (FIG. 1). The transconductance amplifier 10 has dual outputs V01, V02 and uses the second output as a rapid sense pin to have the gate 12a of external output MOSFET transistor 12 discharged quickly. The second output V02, as shown in FIG. 2, is operatively connected through the serial aligned inverters 102, 104, 106 and operative from the lower NPN transistor Q6, which in turn is operative with M10 and M11 and connected to M7 to make the second output VO2 an inverter. The multiple inverters 102, 104, 106 shape the second output signal V02 to be better input into a sharper waveform.

M11 and M7 can be P-channel/N-channel drives for the inverters. M7 could be designed weaker than M11 such that the second output V02 would respond to every single kind of change in the feedback voltage and ensure that the current is larger. The plurality of current mirrors as described and illustrated are cascaded to obtain the larger current to drive the gates of the outputs. The second output V02 uses a smaller current. There is a cascading of current mirrors that begins with a comparator and the circuit current "mirrors" off that and obtains two channels, one for the first output VO1 and one for the second output VO2. Once the feedback loop is settled into operation, an "up" voltage defines a certain current and, at a predetermined operating point, is moved to a amount when the load changes.

When the current is regulated, it is pulling enough current from the output that would define a voltage drop on the sensing resistor. The voltage will match input voltages, which will be equal and produce a certain gate voltage, and respond to the output current flow. This is a normal operating point in regulation when the output is changed. When the transient occurs, it can handle a larger current. The gate will tend to go high and the voltage on the lower side sensing resistor will quickly move down. That will cause the gate voltage to be corrected so that it can handle that current and will take gate voltage. The second loop will pull it back to the place where it should be at VO2. The loop goes into regulation.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A current limiting circuit comprising
   an error amplifier having first and second outputs;
   an output transistor connected to said first output of said error amplifier and forming a feedback loop;
   wherein said second output comprises a replica output of said error amplifier and forms a rapid response feedforward path with said output transistor to aid in fast current limiting.

2. A current limiting circuit according to claim 1, wherein the error amplifier comprises a transconductance amplifier.

3. A current limiting circuit according to claim 1, wherein the output transistor comprises a MOSFET.

4. A current limiting circuit according to claim 1, wherein said feedback loop comprises a current regulating feedback loop.

5. A current limiting circuit according to claim 1, wherein said rapid response feedforward path is operative to control the output transistor.

6. A current limiting circuit according to claim 1, wherein said output transistor includes a gate that is pulled down to a level where the feedback loop goes into regulation.

7. A current limiting circuit according to claim 1, wherein over-current information is acted upon by pulling a gate of the output transistor to a level required by current regulation wherein the feedback loop maintains current at a designed current level.

8. A current limiting circuit according to claim 1, and further comprising a sensing resistor for sensing current within said feedback loop.

9. A current limiting circuit comprising
   an error amplifier having first and second outputs;
   an output transistor having a gate and connected to said first output of said error amplifier and forming a feedback loop;
   a feedforward transistor connected to said second output and the gate of said output transistor, wherein said second output comprises a replica output of said error amplifier and forms a rapid response feedforward path with said output transistor for controlling the gate of the output transistor to aid in fast current limiting.

10. A current limiting circuit according to claim 9, wherein the error amplifier comprises a transconductance amplifier.

11. A current limiting circuit according to claim 9, wherein the output transistor comprises a MOSFET.

12. A current limiting circuit according to claim 9, wherein said feedback loop comprises a current regulating feedback loop.

13. A current limiting circuit according to claim 9, wherein said output transistor includes a gate that is pulled down to a level where the feedback loop goes into regulation.

14. A current limiting circuit according to claim 9, wherein over-current information is acted upon by pulling the gate of the output transistor to a level required by current regulation wherein the feedback loop maintains current at a designed current level.

15. A current limiting circuit according to claim 9, and further comprising a sensing resistor for sensing voltage or current flow within said feedback loop.

16. A current limiting circuit comprising
a transconductance amplifier having first and second outputs, a high voltage input, and mirrored circuits;
an output transistor connected to said first output of said transconductance amplifier and forming a feedback loop;
a feedforward transistor connected to said second output and the gate of said output transistor, wherein said second output comprises a replica output of said error amplifier and forms a rapid response feedforward path with the output transistor for controlling the gate of the output transistor and aid in fast current limiting.

17. A current limiting circuit according to claim 16, wherein the output transistor comprises a MOSFET.

18. A current limiting circuit according to claim 16, wherein said feedback loop comprises a current regulating feedback loop.

19. A current limiting circuit according to claim 16, wherein said high voltage input and mirrored circuits comprise a charge pump circuit.

20. A current limiting circuit according to claim 16, wherein said output transistor includes a gate that is pulled down to a level where the feedback loop goes into regulation.

21. A current limiting circuit according to claim 16, wherein over-current information is acted upon by pulling the gate of the output transistor to a level required by current regulation wherein the feedback loop maintains current at a designed current level.

22. A current limiting circuit according to claim 16, and further comprising a sensing resistor for sensing voltage or current flow within said feedback loop.

23. A method for limiting current in a power circuit subject to fast changing load currents comprising:
forming a feedback loop with an output transistor connected to a first output of an error amplifier; and
forming a replica output from a second output of the error amplifier in a rapid response feedforward path with the output transistor to aid in fast current limiting.

24. A method according to claim 23, which comprises forming the error amplifier as a transconductance amplifier.

25. A method according to claim 23, which comprises forming the output transistor as a MOSFET.

26. A method according to claim 23, which comprises controlling the output transistor by pulling the gate of the output transistor to a level where the feedback loop goes into regulation.

27. A method according to claim 23, which comprises pulling the gate of the output transistor to a level required by current regulation for maintaining a designed current level.

28. A method according to claim 23, which comprises sensing current or voltage flow within the feedback loop through a sensing resistor.

29. A method according to claim 23, which further comprises controlling the output transistor through a feedforward transistor connected to the output transistor.

* * * * *